United States Patent [19]

Olsson et al.

[11] 4,359,252

[45] Nov. 16, 1982

[54] SOCKET FOR A BUBBLE MEMORY PACKAGE

[75] Inventors: Billy E. Olsson, New Cumberland; Lit Y. Kam, Camp Hill, both of Pa.

[73] Assignee: AMP Incorporated, Harrisburg, Pa.

[21] Appl. No.: 185,081

[22] Filed: Sep. 8, 1980

[51] Int. Cl.³ .............................................. H01R 13/22
[52] U.S. Cl. ........................... 339/17 CF; 339/75 MP
[58] Field of Search ........ 339/17 CF, 75 MP, 176 M, 339/176 MP, 17 C, 125 R, 220

[56] References Cited

U.S. PATENT DOCUMENTS

| | | | |
|---|---|---|---|
| 3,061,760 | 10/1962 | Ezzo | 339/17 C |
| 3,805,212 | 4/1974 | Landman et al. | 339/75 MP |
| 3,818,416 | 6/1974 | Reimer | 339/75 MP |
| 3,877,064 | 4/1975 | Scheingold et al. | 357/74 |
| 3,910,664 | 10/1975 | Pauza et al. | 339/17 |
| 3,940,786 | 2/1976 | Scheingold et al. | 357/74 |
| 3,942,854 | 3/1976 | Klein et al. | 339/75 MP |
| 3,951,491 | 4/1976 | Mysiak | 339/17 CF |
| 4,052,118 | 10/1977 | Scheingold et al. | 339/17 |
| 4,130,327 | 12/1978 | Spaulding | 339/17 CF |
| 4,166,665 | 9/1979 | Catchaw | 339/75 MP |
| 4,220,383 | 9/1980 | Scheingold et al. | 339/17 |

FOREIGN PATENT DOCUMENTS

| | | |
|---|---|---|
| 2539379 | 3/1977 | Fed. Rep. of Germany . |
| 2823066 | 12/1978 | Fed. Rep. of Germany . |
| 2920943 | 11/1979 | Fed. Rep. of Germany . |
| 1488648 | 10/1977 | United Kingdom . |
| 2021878 | 12/1979 | United Kingdom . |

Primary Examiner—Joseph H. McGlynn
Attorney, Agent, or Firm—Gerald K. Kita

[57] ABSTRACT

A socket for a bubble memory package includes a pair of housings containing rows of electrical terminals for contact with circuit pads of the package. The housings are aligned by integrally joined tie bars which are removable after assembly of the housings on a circuit board. Metal spring clamps provide large clamping forces to assure electrical contact between the terminals and circuit pads, and to restrain the high mass package during vibration.

8 Claims, 7 Drawing Figures

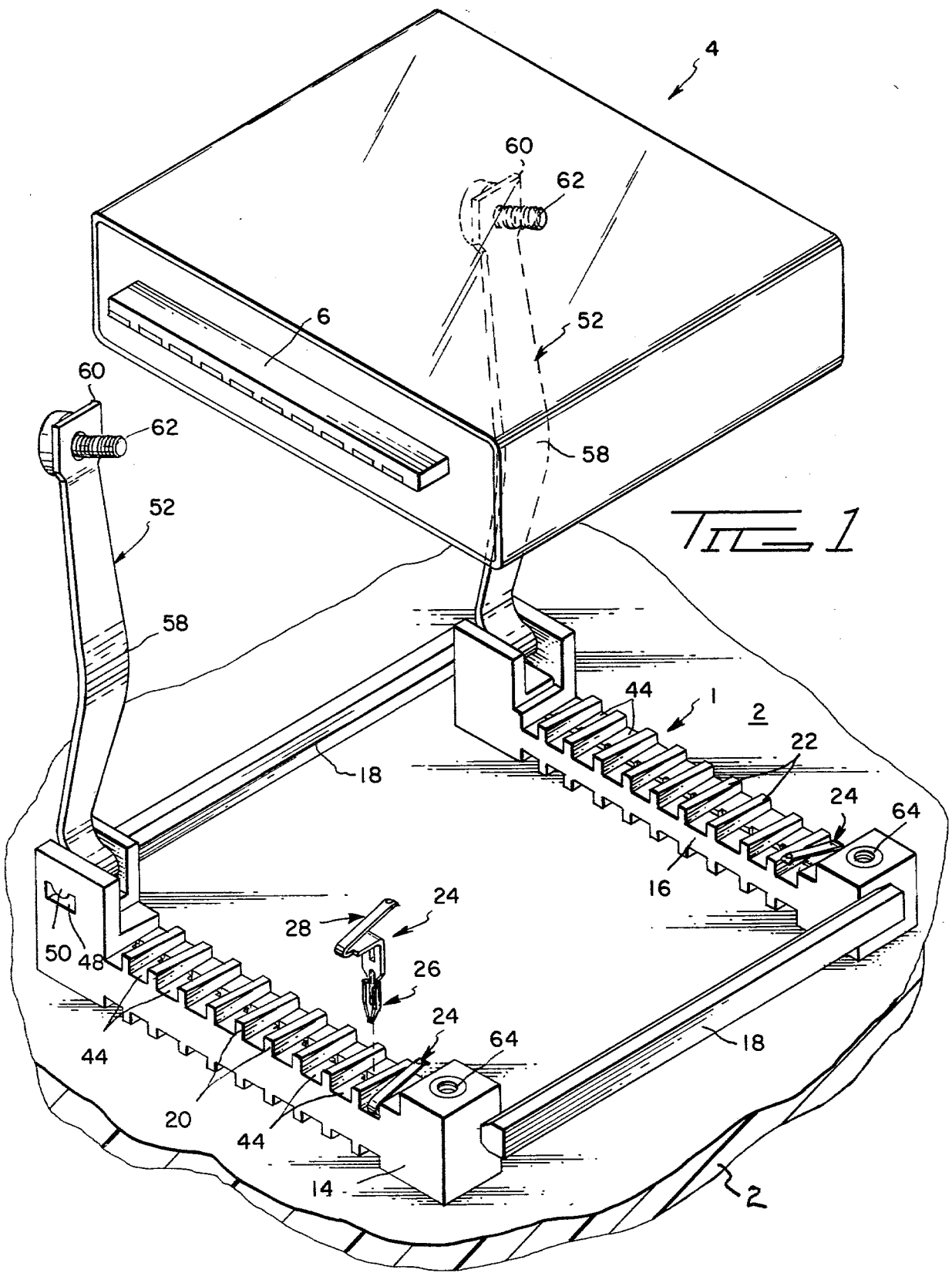

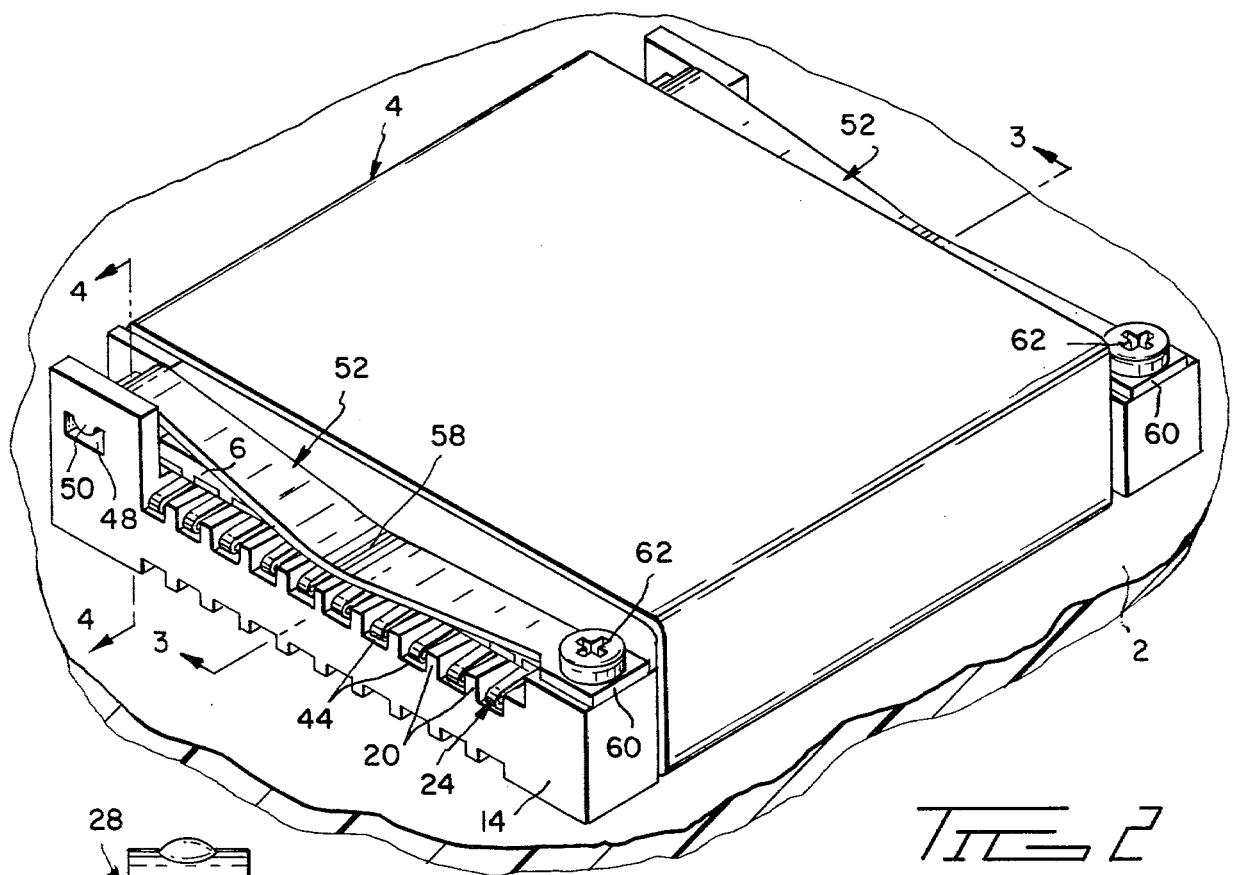
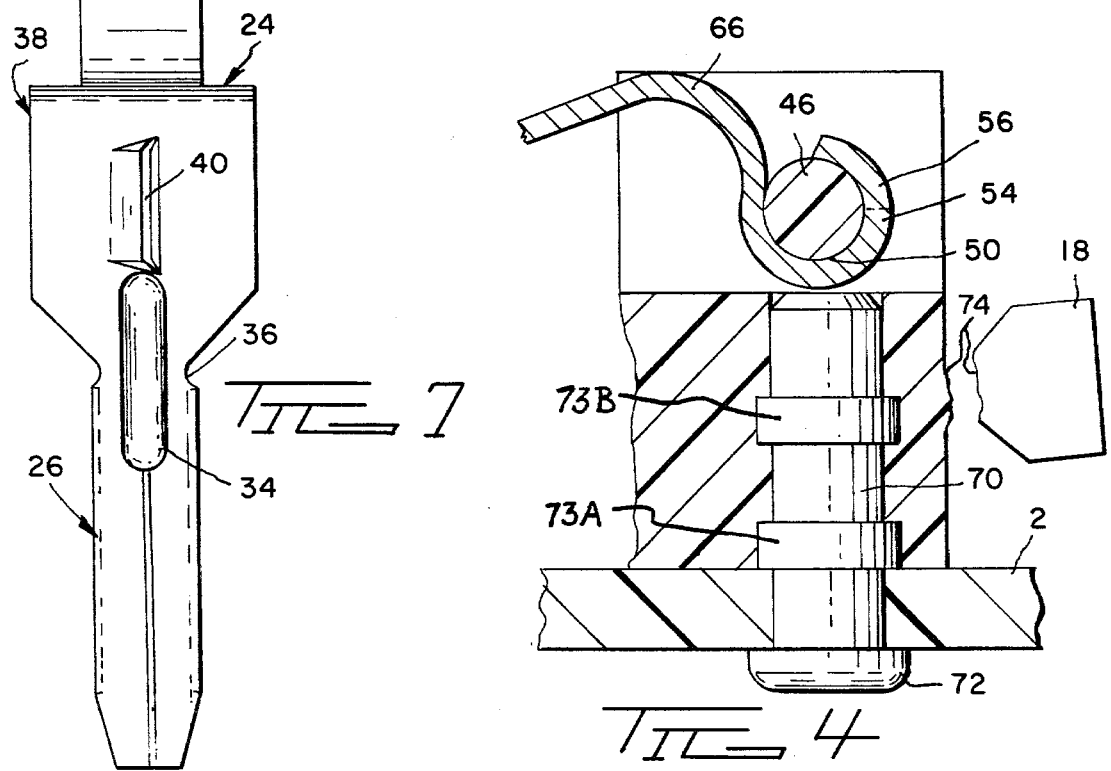

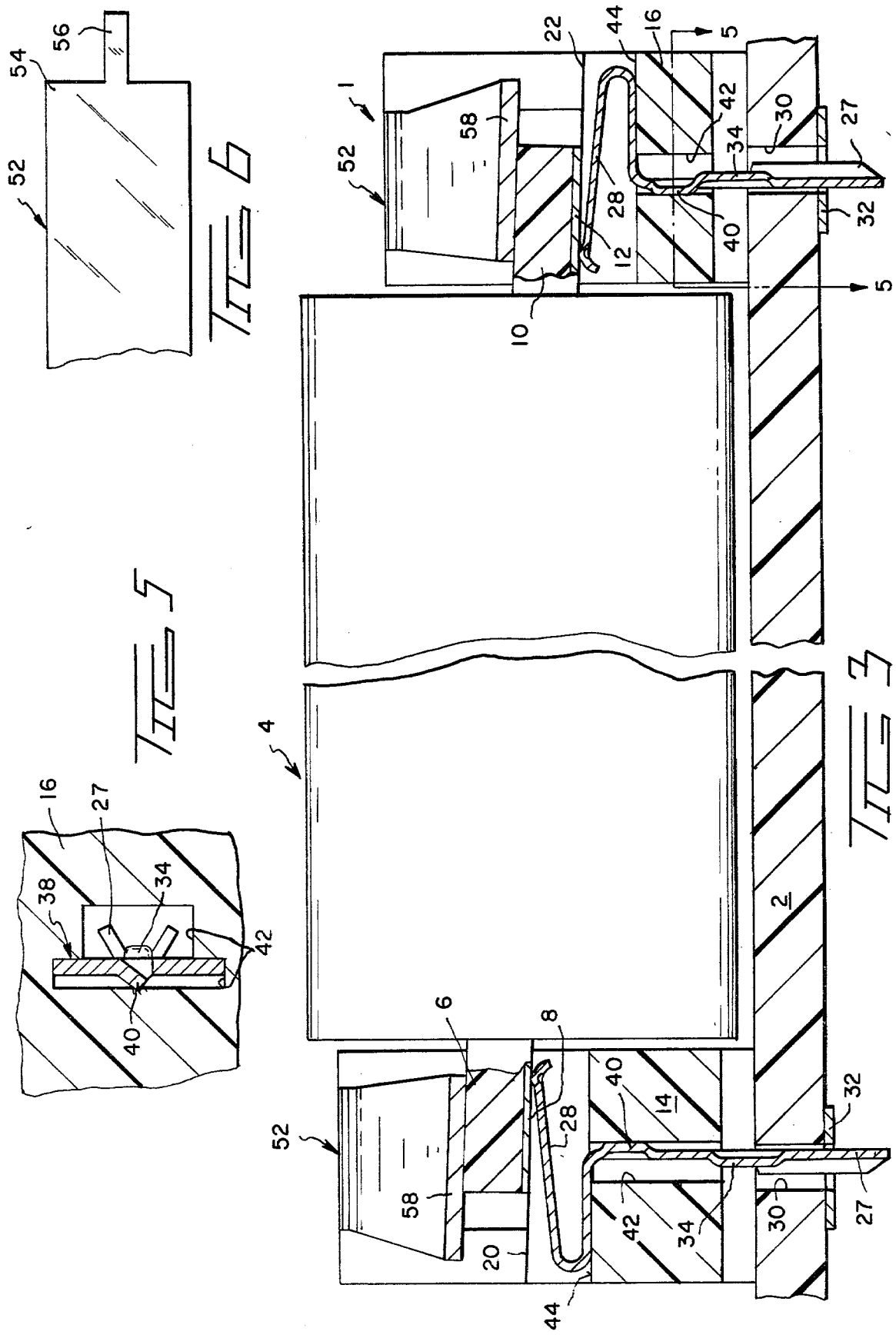

SOCKET FOR A BUBBLE MEMORY PACKAGE

FIELD OF THE INVENTION

The invention relates to a socket for mounting an electronic package on a circuit board, and specifically, a socket with electrical terminals mounted to the circuit board and contacting circuit pads of a bubble memory package which is mounted removably on the socket.

BACKGROUND OF THE PRIOR ART

A bubble memory package contains the bubble memory which is supported on a circuit substrate which has its edges protruding from the package. The substrate is inclined within the package at a proper angle of, approximately, two degrees to permit movement of the bubbles of the memory.

Previous sockets of the type for mounting an electronic package are inadequate for mounting a bubble memory type package. These previous sockets do not support substrates at a precisely controlled inclination as required for a bubble memory substrate. Further, a bubble memory package is considerably heavier, and has a higher inertia, than other electronic packages, such as a large scale integrated circuit package, for example. As a consequence, vibration may cause the circuit pads of the bubble memory package to disconnect momentarily from the socket terminals and cause undesired circuit interruptions. The combined normal forces of the contacts together with the weight of the package contributing to high G-forces during vibration, require a strong retention mechanism for maintaining the package in place on the socket. Because of the above reasons, a socket for a bubble memory package must be rugged, yet miniaturized to cover minimal area when mounted on a circuit board.

SUMMARY OF THE INVENTION

A socket for a bubble memory package comprises a subassembly of parts, including two molded housings containing respective rows of electrical terminals which can be solder connected in a circuit board, and which contain resilient spring portions contacting circuit pads of a bubble memory package. The circuit pads are on the inverted edges of the circuit substrate which project out from sides of the bubble memory package. The substrate edges seat against top surfaces of the housings at precise angular orientations, and support the entire bubble memory package on the socket. Spring clamps are pivotally captivated to the housings and resiliently clamp the substrate against the housing top surfaces and also against the spring portions of the terminals, deflecting resiliently these spring portions to produce electrical contact of these spring portions against the circuit pads. The housings are joined together, and are precisely aligned and oriented by integral alignment bars or tie bars which may be removed once the housings and the terminals thereof are affixed to a circuit board. The bars and the housings are fabricated simultaneously, for example, by molding, by which desired alignment and angular orientation of the housings are obtained at low cost.

The housings are riveted on a circuit board, so that the rivet connections resist the vibration G-forces instead of the solder joints of the socket terminals.

OBJECTS

An object of the present invention is to provide a socket for a bubble memory package, the socket being a completed subassembly of parts and covering minimal area when mounted on a circuit board.

Another object is to provide an electronic socket for a bubble memory package, or other electronic package, the socket having detachable alignment portions which align rows of electrical terminals of the socket, at least until the socket and rows of terminals thereof are permanently secured to a circuit board.

Another object is to provide a socket for a bubble memory package, which socket is secured to a circuit board, and which socket is capable of subsequent division into separate connector sections that are precisely oriented and that cover minimal area on a circuit board.

Another object is to provide a socket which clamps a bubble memory package to insure electrical connections of the socket terminals against the circuits of the bubble memory package.

Another object is to provide a bubble memory socket with rivet connections which resist vibration G-forces.

These and other objects of the invention will become apparent from the following detailed description taken in conjunction with the drawings.

DESCRIPTION OF THE DRAWINGS

FIG. 1 is an enlarged perspective of a socket according to a preferred embodiment, with a terminal and a bubble memory package shown in exploded configuration.

FIG. 2 is an enlarged perspective of an assembly of the structure shown in FIG. 1, with alignment or tie bars of the socket removed.

FIG. 3 is an enlarged section taken along the line 3—3 of FIG. 2.

FIG. 4 is an enlarged fragmentary elevation in section taken along the line 4—4 passing through a hinge portion of the spring shown in FIG. 2.

FIG. 5 is an enlarged fragmentary section taken along the line 5—5 of FIG. 3.

FIG. 6 is a plan view of a portion of a metal blank which forms the spring hinge portion shown in FIG. 4.

FIG. 7 is an enlarged elevation of an electrical terminal.

DETAILED DESCRIPTION

With more particular reference to FIGS. 1-3, a preferred embodiment of a socket 1 is shown mounted on a circuit board 2. A bubble memory package 4 is generally rectangular with rounded corner edges. One side of the package includes a projecting, narrow, planar circuit element in the form of an edge of a circuit substrate 6, the under surface of which includes plural circuit pads 8 arranged in a row alongside the outer edge of the substrate 6. An opposite side of the package includes another, projecting, narrow, planar circuit element, in the form of a circuit substrate edge 10, the undersurface of which includes a row of circuit pads 12 alongside the outer edge of the substrate 10. According to standard practices well known in the manufacture of bubble memory packages, the substrate edge 6 and 10 project into the interior of the package and support the memory circuitry contained in the package. The pads 8 and 12 are formed of conductive material, such as metal plated on the substrate edges 6 and 10, and provide electrical inputs and outputs for the circuitry contained in the package 4. The substrate is inclined precisely at a chosen angle, for example, two degrees, in respect to the planar major surfaces of the package 4. The inclination and narrowness of the protruding substrate edges and the inertia of the relatively heavy package 4 places stringent requirements on the socket 1.

To meet these and other requirements, the socket 1 includes a pair of elongated, spaced apart housings 14 and 16 interconnected by outboard alignment bars or tie bars 18. The housings 14 and 16 and the alignment bars 18 are of plastic composition, advantageously molded as one piece to obtain precise alignment of the housings 14 and 16, so as to support thereon substantial surface areas of the substrate edges 6 and 10, without interference against the sides of the remainder of the package 4. The housings 14 and 16 are as narrow as possible to cover and thereby consume minimal area on the circuit board 2. Alignment of the housings must be precise also because of their narrowness. Once the housings are secured on the circuit board, the outboard alignment bars 18 are readily exposed and may be removed, so that even less area of the circuit board 2 is consumed when covered by the socket 1.

The housings 14 and 16 are of different height and further include respective plural integral ribs 20 and 22 the projecting top surfaces of which are each molded with a precise angular tilt of the same inclination as one of the respective substrates 6 and 10 to be supported thereon. Plural terminals, one of which is shown at 24, are mounted adjacent respective ribs 20 and 22. Each terminal, shown in FIGS. 1 and 3, is stamped and formed of metal strip and includes a mounting post portion 26 and a resilient spring contact portion 28 formed by doubling the terminal back on itself along its length. The post portions 26 are longer, for the terminals 24 which are mounted in the housing 14, than the terminals 24 which are mounted in the housing 16. Otherwise their features are identical. For example, each post portion 26 is formed into a V-shaped, lengthwise channel 27, for plugging freely into a respective aperture 30 of the circuit board 2, and for reception of solder (not shown) to provide a solder connection of the post portion with a respective conductive circuit pad 32 on the circuit board 2. A narrow, bulging flute 34 extends the length of the terminal post portion to stiffen the most narrow width portion 36 thereof.

A midportion 38 of each terminal 24, between the post portion 26 and the contact portion 28, is formed with an elongated louver 40 having a sharp edge projecting outwardly of the thickness of the terminal and extending lengthwise of the terminal in the direction of insertion of the post portion 26 for reception into a respective cavity 42 of the corresponding housing 14 or 16. As shown in FIG. 5, each cavity 42 is of T-shaped cross section, allowing the channel 27 to pass freely through the corresponding housing 14 or 16 to depend therefrom for plugging into the respective circuit board aperture 30. The width of the terminal midportion 38 interfits within the opposed cavity sections which form the T-shaped cross section. The sharp edge of the flute impinges along a side wall of the cavity 42 and wedges the midportion 38 in place and against an opposite bifurcated wall within the cavity 42. The doubled over contact portion 28 seats against a wall 44 recessed adjacent a respective rib 20 or 22. The free end of the contact portion 28 projects above a plane defined along the top surfaces of the respective ribs 20 or 22 to engage a respective circuit pad 8 or 12.

As shown in FIGS. 1 and 4, one end of each housing 14 or 16 is molded with an integral, cylindrical hinge pin 46 formed, with the aid of a core pin (not shown) which is withdrawn from a side of the molded housing 14 or 16, leaving a respective core pin recess 48 and the undercut, cylindrical one-half 50 of the hinge pin 46.

Each housing 14 and 16 includes a stiff, strong, metal leaf spring 52, having a first end 54 and an integral, narrow width tab 56 curled over the cylindrical periphery of a respective hinge pin 46, forming a hinge for pivoting and for captivating the spring 52. A midportion 58 of the spring 52 is bowed toward the respective housing ribs 20 or 22 to engage a respective circuit element or substrate 6 or 10. The opposite end 60 of the spring 52 is apertured to receive a machine screw 62 which threadably secures in an internally threaded, metal fitting 64 which is insert molded or otherwise imbedded in the respective housing 14 or 16. The midportion 58 of the spring 52 will press against a respective substrate 6 or 10 forcing the same against the respective contact portions 28, resiliently deflecting the free ends of the contact portions 28 toward the recessed walls 44, until the substrate 6 or 10 seats against the top wall surfaces of the respective ribs 20 or 22. Each spring develops a relatively large clamping force to insure that the substrates are retained against the contact portions and the top wall surfaces despite vibration tending to dislodge the high mass package 4. The metal screws 62 in the metal fittings 64 are sufficiently strong to withstand such forces. As shown in FIG. 4, each spring end 54 is provided with a bow 66 of reverse curvature in respect to the bow in midportion 58, providing clearance for the substrate edges, adding to resiliency of the spring, and allowing placement of the hinge pin 46 well below the height of the socket, so that the hinge pin is supported by adequate plastic material. Both the fitting 64 and a like imbedded metal fitting 70, located below a respective hinge pin 46, include rivet portions 72 which project through the thickness of the circuit board 2 and are formed with enlarged heads, by peening for example, so that the housings 14 and 16 are permanently secured to the circuit board. Each fitting 64 or 70 includes a first enlarged collar 73A imbedded flush with the bottom of the molded plastic, and providing a rigid foot which supports the housing against the circuit board 2. The collar 73A cooperates with the enlarged rivet head to support and seat rigidly against opposite sides of the circuit board 2 and resist vibration G-forces, relieving the solder joints of the terminals 26 from the G-forces. A second enlarged collar 73B is imbedded in the plastic to resist tearing away of the plastic from the fitting 64 or 70 due to vibration G-forces. Following formation of the rivet connections and also soldering the terminal post portions 26, the alignment bars 18 may be clipped off, by severing the narrow neck portions 74 joined to the housings 14 and 16 as shown in FIG. 4, leaving the socket as a divided pair of housings 14 and 16 covering a minimum area of the circuit board 2.

Although a preferred embodiment of the present invention is disclosed, other embodiments and modifications thereof which would be apparent to one having ordinary skill are intended to be covered by the spirit and scope of the appended claims.

What is claimed is:

1. A socket for an electronic package in which the socket is adapted for mounting on a circuit board and electrical connections are established between terminals of the socket and circuit pads on said package, the socket comprising:

first and second housings containing respective rows of said terminals, said housings being of different height and having inclined top wall surfaces supporting a circuit element of said package at a desired incline on a circuit board, said terminals having resilient spring portions projecting outwardly beyond said top wall surfaces and engageable with circuit pads on each said circuit element and being resiliently deflected by each said circuit element seated against said top wall surfaces, and a resilient spring element overlying the reverse side of each said circuit element and clamping each said circuit element against said deflected spring portions and against respective said top wall surfaces.

2. The structure as recited in claim 1, wherein rivets are provided in each of said housings, each rivet including a first enlarged collar imbedded in a respective said housing and a second enlarged collar exposed from a respective said housing and constructed to engage a surface of a circuit board for mounting said housing, and each rivet including a portion constructed for formation into an enlarged head engageable on another surface of the circuit board for mounting said housing.

3. The structure as recited in claim 1, wherein each said spring element includes a hinge portion pivotally secured to respective said housings, and further including: means securing each said spring element in clamped relation on a respective said circuit element.

4. The structure as recited in claim 3, wherein, each said hinge portion is a curled portion of said spring element encircling a hinge pin of said housing.

5. The structure as recited in claim 1, wherein, said housings are joined by removable tie bars.

6. The structure as recited in claim 5, wherein, said tie bars are integrally joined to said housings by frangible means.

7. The structure as recited in claim 1, wherein, said terminals each includes an elongated louver bulging outwardly of its thickness and providing a sharp edge lengthwise of the direction of insertion of said terminal in a respective terminal receiving cavity in a respective said housing.

8. The structure as recited in claim 7, wherein, each said terminal has its sharp edge against a wall of a respective said cavity, and a portion of said terminal is wedged against an opposite wall of said cavity.

* * * * *